(12) United States Patent
Lu et al.

(10) Patent No.: US 8,570,638 B2
(45) Date of Patent: Oct. 29, 2013

(54) METHOD OF FABRICATING AN INTEGRATED DEVICE

(71) Applicant: Silicon Light Machines Corporation, Sunnyvale, CA (US)

(72) Inventors: Joshua Lu, Austin, TX (US); Gregory Beach, Round Rock, TX (US); Alexander P. Payne, Ben Lomond, CA (US); James Hunter, Campbell, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 0 days.

(21) Appl. No.: 13/648,932

(22) Filed: Oct. 10, 2012

(65) Prior Publication Data

US 2013/0034958 A1 Feb. 7, 2013

Related U.S. Application Data

(63) Continuation of application No. 12/639,899, filed on Dec. 16, 2009, now Pat. No. 8,320,038.

(60) Provisional application No. 61/201,887, filed on Dec. 16, 2008.

(51) Int. Cl.
*G02B 26/00* (2006.01)

(52) U.S. Cl.
USPC .......................................... 359/291; 359/290

(58) Field of Classification Search
USPC ...................................... 351/290, 291
See application file for complete search history.

(56) References Cited

U.S. PATENT DOCUMENTS

| | | | | |
|---|---|---|---|---|
| 5,612,253 | A * | 3/1997 | Farahani et al. | 438/643 |
| 6,012,336 | A * | 1/2000 | Eaton et al. | 73/754 |
| 2002/0146897 | A1* | 10/2002 | Nulty et al. | 438/586 |
| 2003/0235932 | A1* | 12/2003 | Hunter | 438/27 |

* cited by examiner

*Primary Examiner* — Mahidere Sahle
(74) *Attorney, Agent, or Firm* — William Nuttle

(57) ABSTRACT

A method of fabricating an integrated device including a MicroElectroMechanical system (MEMS) and an associated microcircuit is provided. In one embodiment, the method comprises: forming a high temperature contact through a dielectric layer to an underlying element of a microcircuit formed adjacent to a MicroElectroMechanical System (MEMS) structure on a substrate; and depositing a layer of conducting material over the dielectric layer, and patterning the layer of conducting material to form a local interconnect (LI) for the microcircuit overlying and electrically coupled to the contact and a bottom electrode for the adjacent MEMS structure. Other embodiments are also provided.

19 Claims, 7 Drawing Sheets

METHOD OF FABRICATING AN INTEGRATED DEVICE

CROSS-REFERENCE TO RELATED APPLICATIONS

The present application is a continuation of U.S. application Ser. No. 12/639,899, filed Dec. 16, 2009, which claims the benefit of priority under 35 U.S.C. 119(e) to U.S. Provisional Patent Application Ser. No. 61/201,887, entitled "CMOS Fabrication Flow for MEMS Adjacent Interconnect," filed Dec. 16, 2008, both of which are hereby incorporated by reference.

TECHNICAL FIELD

The present invention relates to integrated devices, and more particularly to methods of integrating a MicroElectro-Mechanical System (MEMS) and associated microcircuits on the same chip.

BACKGROUND

Combining MicroElectroMechanical System (MEMS) and associated microcircuits or ICs (integrated circuits), such as drivers, onto a common substrate would produce significant advantages including, for example, higher channel counts. Unfortunately, the manufacturing processes for ICs and the MEMS devices are generally not compatible, and thus the direct integration of MEMS and microcircuit onto a monolithic substrate is challenging. Particularly challenging is integrating contact and metallization technology commonly used in microcircuit fabrication with high temperature processes of MEMS fabrication without compromising contact performance.

The current technology utilizes deep contacts formed after fabrication of the MEMS is substantially or entirely complete. This approach works but limits the minimum contact feature size due to the aspect ratio of the contacts. Conversely, a height or vertical stack-up of the MEMS is limited by the contact capability.

SUMMARY

A method of monolithically fabricating an integrated device including a MicroElectroMechanical systems (MEMS) device and an associated microcircuit or integrated circuit on a single substrate is provided. Generally, the method comprises: forming a high temperature contact through a dielectric layer to an underlying element of a microcircuit formed adjacent to a MicroElectroMechanical System (MEMS) structure on a substrate; and depositing a layer of conducting material over the dielectric layer, and patterning the layer of conducting material to form a local interconnect (LI) for the microcircuit overlying and electrically coupled to the contact and a bottom electrode for the adjacent MEMS structure. Preferably, the method further includes deposition and patterning of alternating dielectric and metal layers to form at least two metal interconnect layers (M1 and M2) in the microcircuit, while the MEMS structure is protected from the dry etch processes used to pattern the metal layers by a first interlevel dielectric layer (ILD). More preferably, after completion of the interconnect layers (M1 and M2), remaining dielectric material is removed from the MEMS structure using a highly selective buffered oxide (BOE) wet etch process. Other embodiments are also provided.

BRIEF DESCRIPTION OF THE DRAWINGS

These and various other features of the optical navigation system and spatial frequency filter will be apparent upon reading of the following detailed description in conjunction with the accompanying drawings and the appended claims provided below, where:

DETAILED DESCRIPTION

The present disclosure is directed generally to an integrated device including a MicroElectroMechanical System (MEMS) formed adjacent to a microcircuit, and methods of forming or fabricating the same. The method is particularly useful for fabricating a MEMs spatial light modulator (SLM), such as a Grating Light Valve (GLV™) or a Planar Light Valve (PLV™), both of which are commercially available from Silicon Light Machines, Inc., of Sunnyvale, Calif., and its associated driver.

Figure 1:
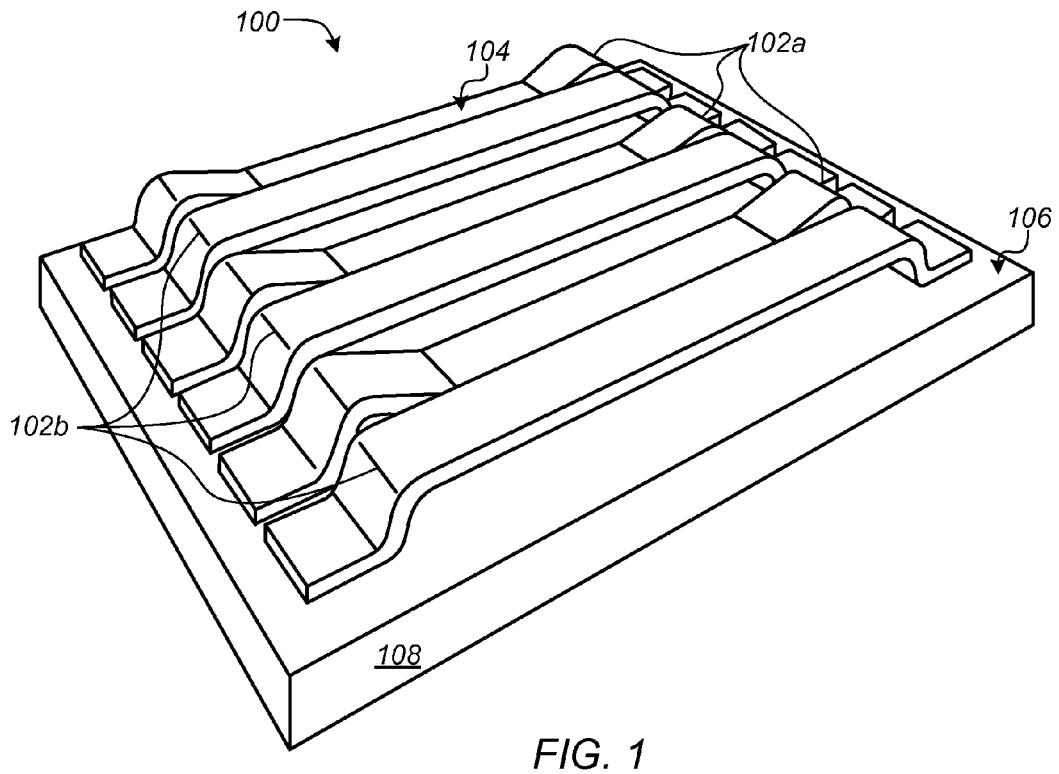
FIG. 1 is a perspective view of a ribbon-type spatial light modulator (SLM) for which a method according to an embodiment of the present disclosure is particularly useful.

Referring to FIG. 1, a ribbon-type SLM 100 generally includes a number of ribbons 102a, 102b; each having a light reflective surface 104 supported over a surface 106 of a substrate 108. One or more of the ribbons 102a are deflectable toward the substrate 108 to form an addressable diffraction grating with adjustable diffraction strength. The ribbons are 102a deflected towards base electrodes (not shown in this figure) formed in or on the substrate 108 by electrostatic forces when a voltage is applied between the deflectable ribbons 102a and the base electrodes. The applied voltages controlled by drive electronics (not shown in this figure), which may be integrally formed in or on the surface 106 of the substrate 108 below or adjacent to the ribbons 102. Light reflected from the movable ribbons 102a adds as vectors of magnitude and phase with that reflected from stationary ribbons 102b or a reflective portion of the surface 106 beneath the ribbons, thereby modulating light reflected from the SLM 100.

Ribbon-type spatial light modulators 100 are increasingly being used in numerous applications including, for example, display systems, optical information processing and data storage, printing, and maskless lithography. However, for many applications requiring high or very high resolution, such as maskless lithography in leading edge semiconductor and MEMS fabrication, SLMs having a two-dimensional array of MEMS are preferred.

Figure 2:
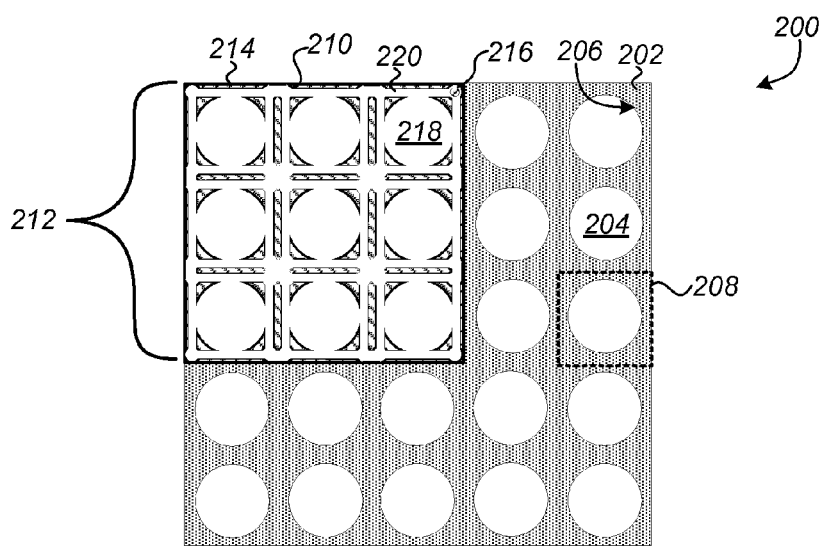
FIG. 2 is a perspective view of a planar light valve type SLM for which a method according to an embodiment of the present disclosure is particularly useful.

Referring to FIG. 2, one such type of SLM, the PLV™ 200 generally includes two films or membranes having light reflecting surfaces of substantially equal area and reflectivity disposed above an upper surface of a substrate (not shown in this figure). The topmost membrane is a static tent member or faceplate 202 of a uniform, planar sheet of a material having a first planar light reflective surface, for example a taut silicon-nitride film having an aluminized surface. The faceplate 202 covers an underlying actuator membrane 210, which includes a number of flat, displaceable or movable pistons or actuators 204. An array of apertures 206 extend through the faceplate 202 to expose in the underlying actuators 204. The actuators 204 have second planar light reflective surfaces parallel to the light reflective surface of the faceplate 202 and positioned relative to the apertures 206 to receive light passing through the apertures. Each of the actuators 204, the associated apertures 206 and a portion of the faceplate 202 immediately adjacent to and enclosing the aperture form a single, individual PLV cell, diffractor cell or diffractor 208.

Individual actuators 204 or groups of actuators are moved up or down over a very small distance (typically only a fraction of a wavelength of incident light) relative to the first planar light reflective by electrostatic forces controlled by drive electrodes in the substrate underlying the actuator membrane. Preferably, the actuators 204 can be displaced by n*λ/4 wavelength, where λ is a particular wavelength of light incident on the first and second planar light reflective surfaces, and n is an integer equal to or greater than 0. Moving the actuators 204 brings reflected light from the second planar light reflective surface into constructive or destructive interference with light reflected by the first planar light reflective surface, thereby modulating light incident on the PLV™ 200.

As noted above, the size and position of each of the apertures 206 are generally predetermined to satisfy an "equal reflectivity" constraint. That is the reflectivity of the area of a single actuator 204 inside a cell or diffractor 208 is equal to the reflectivity of the remaining area of the diffractor that is outside the aperture 206. If the reflectivity of each of the first and second surfaces are the same, then this principle reduces to an "equal area" constraint. As an example of the "equal area" constraint, where the faceplate 202 contains an array of circular apertures 206 in square-shaped diffractors 208, as shown in FIG. 2, the area of a circular aperture 206 inside in a unit length square diffractor 208 is equal to the remaining area (outside circle but inside square).

The faceplate 202 is generally static or stationary and may be anchored or secured to the substrate, for example, by a number of posts regularly spaced across the PLV™ 200, or only at a perimeter of the PLV™. In a preferred embodiment, the faceplate 202 is periodically secured to the underlying substrate by posts at each corner of each pixel or diffractor 208. More preferably, the faceplate 202 includes an electrically conductive material, such as titanium-nitride (TiN), and is electrically coupled to a ground in the substrate through one or more of the posts. Alternatively, the faceplate 202 could be electrically floating to eliminate possible deformation under electrostatic force from interaction with actuator drive electrodes in the substrate.

FIG. 2 also shows a cut away view of a portion of the actuator membrane 210 including a single 3×3 pixel 212. In the embodiment shown, the actuator 204 of the diffractor 208 includes uniform, planar disks 218 each having a planar reflective surface and flexibly coupled by hinges or flexures 220 of an elastic material, such as silicon-nitride ($Si_xN_y$), to one or more posts 216.

Integrated devices including a MEMS and a microcircuit monolithically formed on a single substrate or chip according to embodiments of the present invention and methods of fabricating the same will now be described with reference to FIG. 3-6. For purposes of clarity, many of the details of MEMS and IC fabrication, which are widely known and not relevant to the present invention, have been omitted from the following description. MEMS and IC fabrication methods are described, for example, in commonly assigned U.S. Pat. No. 6,767,751, entitled, "Integrated driver process flow," by James Hunter, issued on Jul. 27, 2004.

Figure 3:
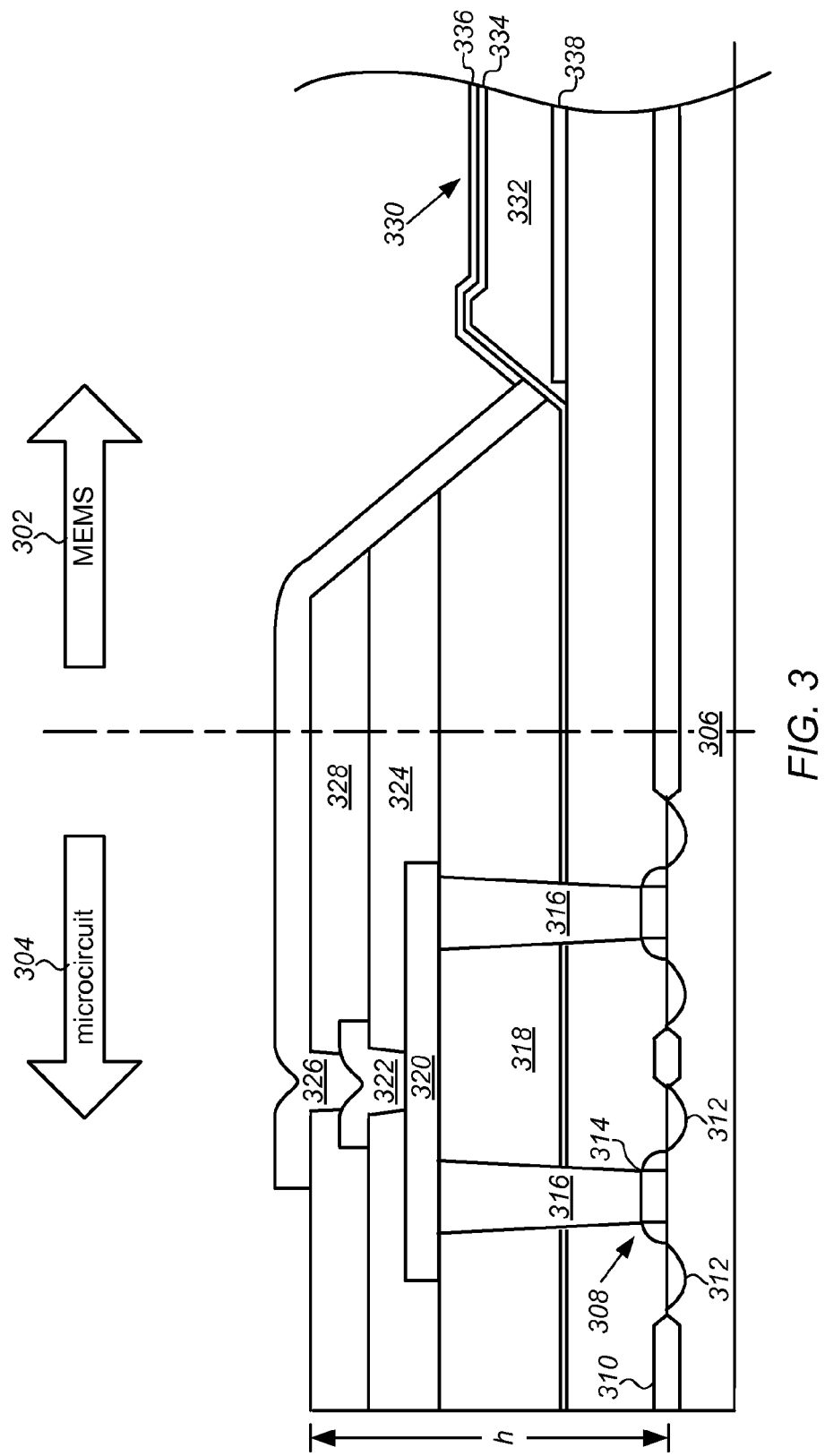
FIG. 3 is a cross-sectional view of a MEMS formed adjacent to a microcircuit having a 3-level metallization scheme according to an embodiment of the present disclosure.

A cross-sectional side view of a portion of an integrated device 300 including a MEMS 302 and a microcircuit 304 monolithically formed in and on a single substrate 306 is shown in FIG. 3. Referring to FIG. 3, the microcircuit 304 generally includes a plurality of transistors 308 separated by isolation structures, such as field oxidation (FOX 310) and including doped source-drain regions 312 and gates 314 formed in the substrate 306 adjacent to and/or underlying the MEMS 302. Contacts 316 extend through openings etched in a dielectric layer 318 covering the transistors 308 to electrically couple gates 314 of the transistors and other regions in the substrate 306 to a local interconnect (LI 320) for the wiring of the microcircuit 304. Additional alternating metal and dielectric layers are formed over the LI 320 to electrically couple thereto. It has been found that reasonably sophisticated circuit designs, such as those used to operate or drive a MEMS 302, can be realized with a microcircuit 304 including a total of three to five metal layers including the LI. In the embodiment shown, the microcircuit 304 includes a first patterned metal layer (M1 322) overlying a first inter-level dielectric layer (ILD 324) and patterned to form contacts electrically coupled to the LI 320, and a second patterned metal layer (M2 326) overlying a second ILD 328 electrically coupled to the metal layer. Optionally, each layer of metallization, i.e., LI 320, M1 322 and M2 326, and the entire microcircuit 304 are covered by cap-oxides (not shown).

The MEMS 302 generally includes at least one moveable actuator 330, a portion of which is suspended above the substrate 306 and separated therefrom by a gap 332 or void formed by the removal of a sacrificial layer (not shown) following formation of the actuator. Where the MEMS 302 is a diffractive, spatial light modulator (SLM), the actuator 330 generally includes a layer of elastic material, such as silicon nitride layer 334, covered or overlaid by a film or layer of metal 336 that serves as both an actuator electrode and a reflective surface for the SLM. In operation the actuator 330 is electrostatically deflected or moved towards a bottom electrode 338 formed in or on a surface of the substrate 306 by application of a voltage differential applied between the electrode and the layer of metal 336 of the actuator.

As noted above, one problem with manufacture of integrated devices 300 using conventional fabrication techniques is that the metallization used to form the interconnects and contacts of the microcircuit 304 cannot withstand the high temperature processes used to fabricate the MEMS 302. Thus, the MEMS 302 must be fabricated first, after the forming of the transistors 308, prior to the metallization to form the microcircuit 304, and material overlying the MEMS removed in an open array etch step. This has a number of negative impacts on fabrication of the integrated device 300. First, the MEMS is overlaid with a number of alternating metal and dielectric layers that must be removed after completion of the microcircuit. Second, no contacts 316, and therefore few or no transistors, can be formed under the MEMS, thereby increasing the surface area of the device dedicated to the microcircuit 304 and correspondingly decreasing the area of the MEMS and the optical efficiency. Finally, the conventional approach typically results in high aspect ratio contacts 316, which are problematic from a standpoint of yield of working devices, and can limit the number of layers of metallization in the microcircuit, since it is undesirable to have too many layers overlying the MEMS that must be removed, and the MEMS is susceptible to damage through over etching used in the metallization processes.

Accordingly, in a first aspect of the present invention a method of fabricating an integrated device is provided in which all cap-oxides are eliminated and thicknesses of metallization and dielectric layers LI 320, M1 322, M2 326, dielectric layer 318, ILD 324 and ILD 328, are reduced using process controls and chemical mechanical planarization (CMP). In particular, referring to FIG. 3, it has been found limiting the overall height (h) of the metallization and dielectric layers to 3.7 microns (μm) and more preferably to 2.8 or less, problems with opening or exposing the MEMS 302 and with aspect ratios of the contacts 316 are substantially avoided. This is accomplished by following each metallization and dielectric deposition with a CMP process to limit each LI and metal layer to thicknesses of from about _____ to about _____ Angstroms (Å), and each dielectric layer and ILD to thicknesses of from about _____ to about _____ (Å). Although not shown, the LI and metal layers can further include waffling, that is adding a dummy features or waffles in regions where a pattern density of the metal lines is low to improve CMP.

It will be appreciated that an advantage of the above approach is that it can be readily included in existing fabrication process flows, substantially without the introduction of new materials or steps, and enables the realization of more complex microcircuits having three or more levels of metallization.

In another aspect, an integrated device and method of forming the same are provided that utilizes high temperature contacts formed before MEMS fabrication and the introduction of microcircuit metallization layers during the MEMS fabrication to enable the integrated devices having microcircuits with three or more levels of metallization, reduced surface area dedicated to the microcircuits, and reduction in material to be removed in an MEMS open etch step, all while avoiding problems associated with high-aspect ratio contacts.

Figure 4:
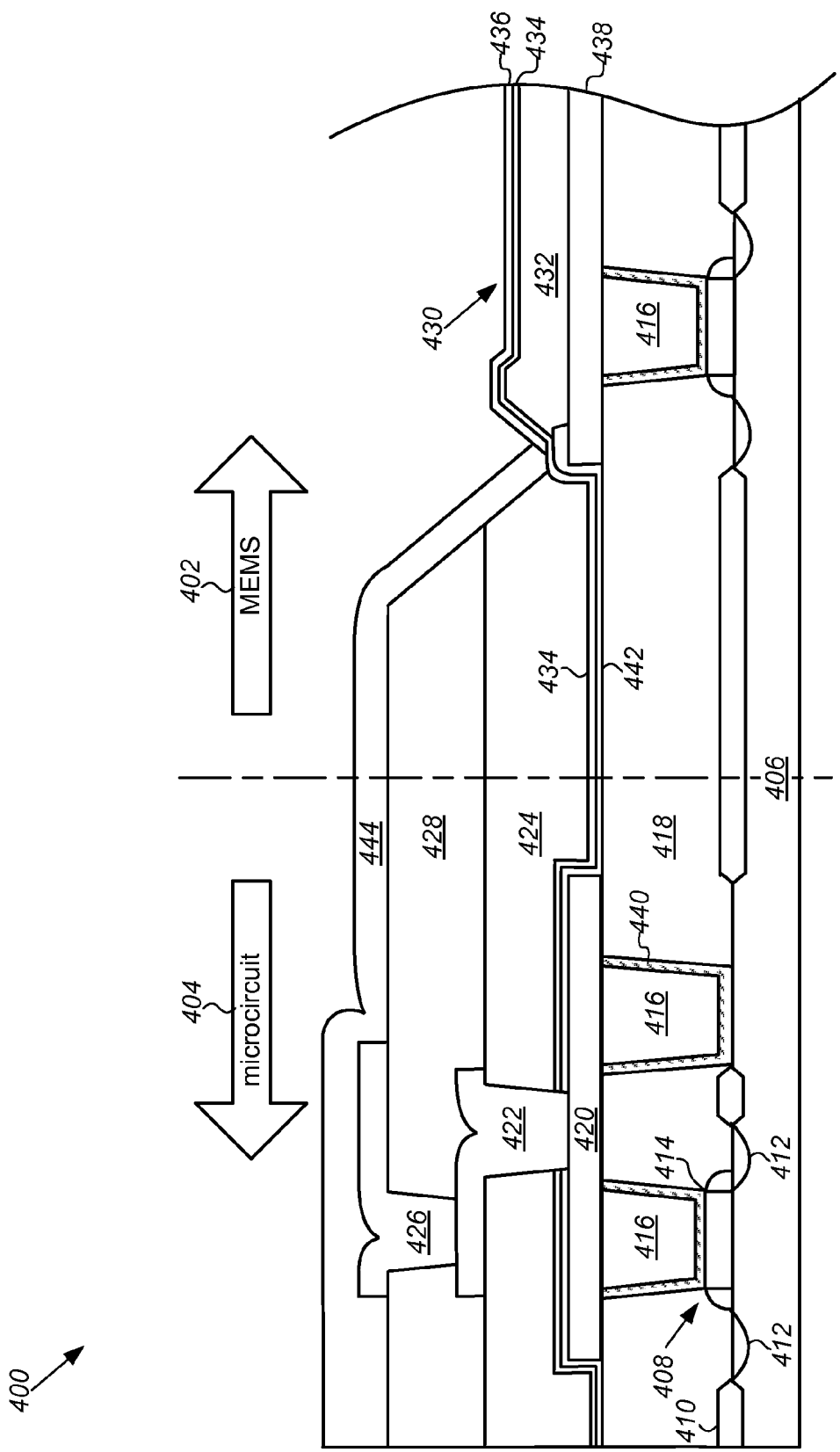
FIG. 4 is a cross-sectional view of a MEMS formed adjacent to a microcircuit having a 3-level metallization scheme and a high-temperature contact according to an embodiment of the present disclosure.

A cross-sectional side view of a portion of an integrated device 400 with MEMS 402 and a microcircuit 404 including a three-level metallization scheme and a high-temperature contact is shown in FIG. 4. As with the microcircuit of the integrated device described above with respect to FIG. 3, the microcircuit 404 of the integrated includes a plurality of transistors 408 separated by isolation structures 410 and including doped source-drain regions 412 and gates 414 formed in the substrate 406 adjacent to and/or underlying the MEMS 402. Contacts 416 extend through openings etched in a dielectric layer 418 covering the transistors 408 to electrically couple gates 414 of the transistors and other regions in the substrate 406 to a local interconnect (LI 420) for the wiring of the microcircuit 404. Additional alternating metal and dielectric layers are formed over the LI 420 including a first patterned metal layer (M1 422) overlying a first ILD 424 and a second patterned metal layer (M2 426) overlying a second ILD 428.

The MEMS 402 includes at least one moveable actuator 430, a portion of which is suspended above and separated from the substrate 406 by a gap 432. The actuator 430 includes a layer of elastic material, such as silicon nitride layer 434, covered or overlaid by a film or layer of metal 436 that serves as both an actuator electrode and a reflective surface for the SLM. The actuator 430 is electrostatically deflected or moved towards a bottom electrode 438 by application of a voltage differential applied between the electrode and the layer of metal 436.

The integrated device 400 of FIG. 4 and the fabrication thereof differs in a number of significant ways from that described above with respect to FIG. 3, including: (i) a high temperature capable metal contact 416, which includes a robust barrier layer 440; (ii) a thin protective buffer oxide 442 overlying the contact and LI 420; (iii) dry etching or patterning of metal lines M1 422 and M2 426 in dense microcircuit 404 area; and (iv) use of a highly selective wet removal of metal over MEMS 402 structures.

Figure 5A:
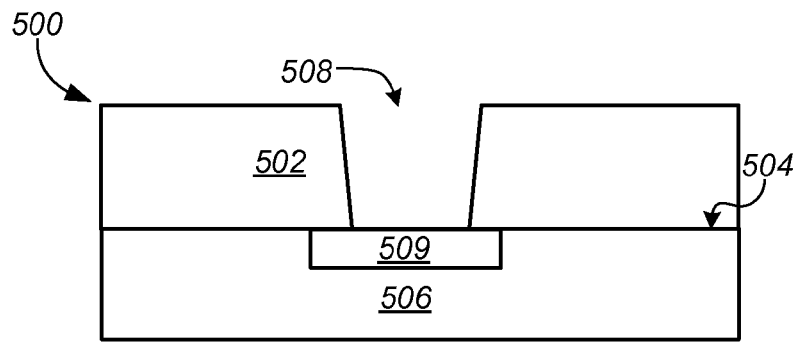
FIGS. 5A-5H are cross-sectional views through a substrate illustrating an embodiment of a fabrication process of an integrated device according to the present disclosure.

A method or process flow for fabricating a high-temperature contact according to an embodiment of the present invention will now be described in detail with reference to FIGS. 5A to 5H. Referring to FIG. 5A, the method of forming a high-temperature contact 500 begins with depositing or forming a dielectric layer 502 over a surface 504 of a substrate 506. The substrate 506 may include any known semiconductor material, such as Silicon, Gallium-arsenide, Germanium, Gallium-nitride, Aluminum-phosphide, and mixtures or alloys thereof. Preferably, the substrate 506 is a doped or undoped silicon-based semiconductor substrate, such as a monocrystalline silicon, silicon-germanium, silicon-on-insulator, or silicon-on-sapphire substrate. The dielectric layer 502 can include, for example, a doped or undoped oxide, such as silicon-dioxide ($SiO_2$), a nitride, such as silicon nitride ($Si_xN_y$), a silicon-oxynitride ($Si_xO_yN_z$) or a glass, such as phosphosilicate glass (PSG) or borophosphosilicate glass (BPSG). Depending on the dielectric, the dielectric layer 502 can be formed or grown, for example by thermal oxidation, or deposited by chemical vapor deposition (CVD) or plasma enhanced CVD (PECVD). Next, a contact opening 508 is formed through the dielectric layer 502 to expose an underlying structure 509 of a microcircuit (not shown) at least partially formed in or on the substrate 506. The underlying structure 509 can include, for example, a local interconnect (LI), a gate electrode of a semiconductor device, or a diffusion region, such as source or drain regions of the device, formed prior to depositing or forming of the dielectric layer 502. The LI or gate electrode layer can include any suitable conducting metal or material including, for example, a doped polycrystalline-silicon (poly) layer or titanium nitride (TiN). The contact opening 508 is formed through the dielectric layer 502 using standard photolithographic and wet or dry etching techniques. Optionally, the method further includes cleaning the contact opening 508 using an RF sputter etch-clean prior to further processing.

Figure 5B:
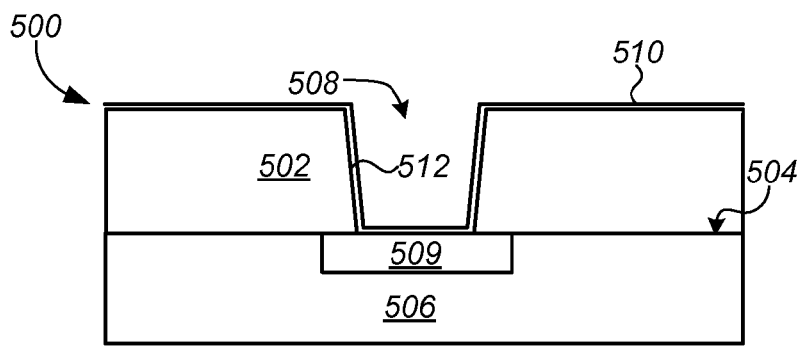
Figure 5C:
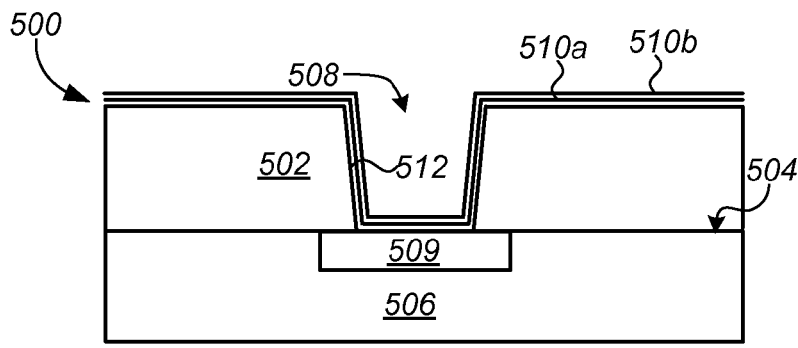

Referring to FIG. 5B, a thin seed layer 510 comprising a refractory metal is deposited over the dielectric layer 502 and on at least one surface 512, i.e., sidewalls and bottom, of the contact opening 508. By refractory metals it is meant metals of elements of the groups 4, 5 and 6 of the periodic table, including titanium (Ti), tantalum (Ta), tungsten (W), and nitrides or alloys thereof, which are resistant to high temperatures. By thin it is meant a seed layer 510 having a thickness of from 100 to 1000 Å deposited, for example, by physical vapor deposition, such as sputtering or evaporation, or by electroless plating. Optionally, as shown in FIG. 5C, the seed layer 510 can be a multi-layer seed layer including two or more layers each having a thickness of between 100 to 1000 Å, and each having a different stoichiometric composition of metals, nitrides or alloys. In one embodiment, the multi-layer seed layer 510 can include a first or bottom layer 510a of titanium and a second or top layer 510b of titanium-tungsten (TiW).

Figure 5D:
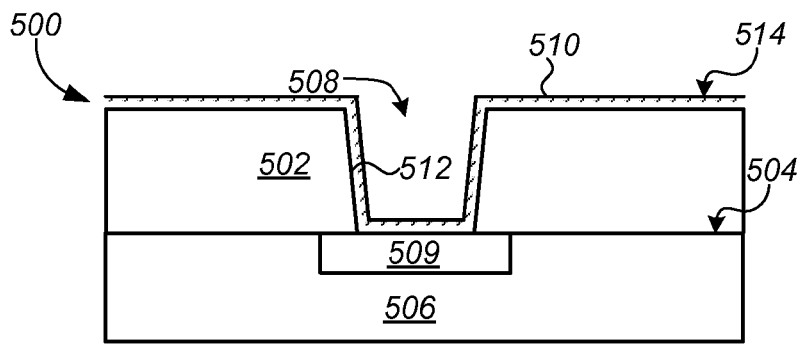

Referring to FIG. 5D, next a top surface of the seed layer 510 is nitrided to form a barrier layer 514 to substantially prevent interaction of the subsequently deposited metal of the contact (not shown in this figure) with silicon in the underlying structure 509 of a microcircuit. The barrier layer can include metal nitrides, such as titanium nitride (TiN), tantalum nitride (TaN), or a titanium-tungsten nitride (TiWN$_x$), extending to a depth of from 10 to 100 Å top surface of the seed layer 510. In one embodiment, the barrier layer 514 is a TiN layer that also serves as an adhesion layer to improve adhesion of the metal of the contact (not shown in this figure) to the underlying structure 509.

Nitriding of the seed layer 510 is accomplished by heating the substrate 506 to a predetermined temperature and exposing the surface of the seed layer 510 to a nitrogen containing atmosphere for a predetermined period of time. In one embodiment, the substrate 506 is heated to a temperature of between 750 to 950° C. in a process chamber of a rapid thermal processing (RTP) tool into which ammonia (NH$_3$) is introduced at a flow rate of between 10 to 10,000 standard cubic centimeters per minute (sccm) for between 10 to 500 seconds. When the ammonia comes into contact with the heated substrate 506 it disassociates into hydrogen and nitrogen, which then diffuses into the surface of the seed layer 510. In addition, to nitriding the surface of the seed layer 510, heating the substrate 506 to a temperature of between 750 to 950° C. sinters the seed layer improving a final contact resistance of the contact 500.

Figure 5E:
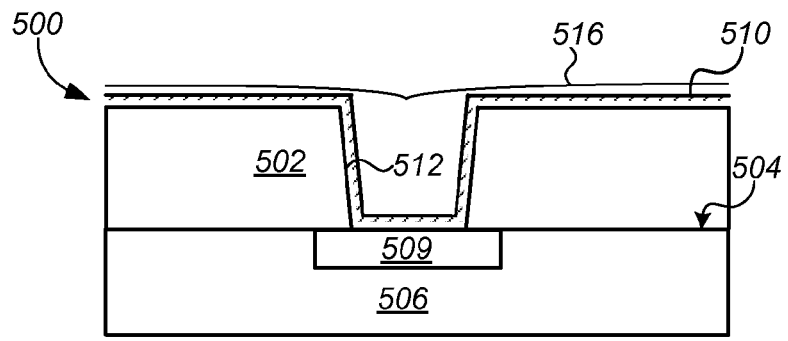

Referring to FIG. 5E, a metal 516 is deposited over the barrier layer 514 to form the contact 500 in the contact opening. Preferably, the metal 516 is a refractory metal resistant to high temperatures, such as titanium (Ti), tantalum (Ta), tungsten (W) or alloys thereof, and is deposited by CVD or PECVD. In one embodiment, the metal 516 is tungsten (W) deposited by CVD over a titanium (Ti) seed layer 510, and a titanium-nitride (TiN) barrier layer 514.

Figure 5F:
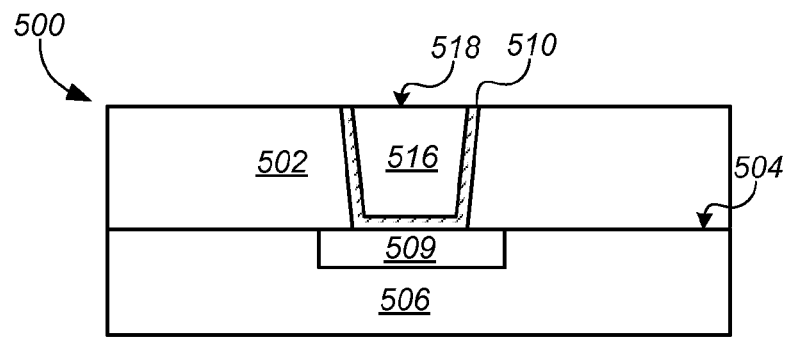

Referring to FIG. 5F, the surface of the metal 516 is then planarized or polished using a chemical mechanical planarization or polishing (CMP) process to provide a planar surface 518, over which a high temperature cap (not shown in this figure) can be subsequently formed.

Figure 5G:
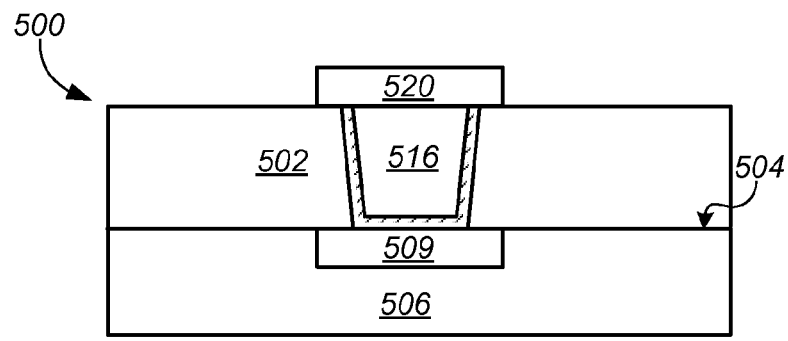
Figure 5H:
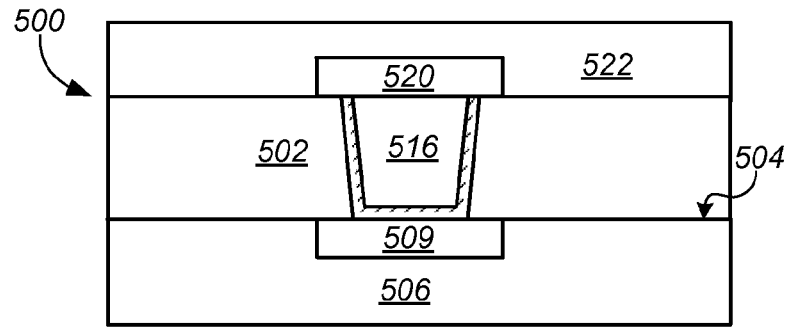

Referring to FIGS. 5G and 5H, the high temperature cap can include a local interconnect 520 (LI) covered by a capping dielectric or oxide 522. As with the underlying structure 509 the local interconnect 520 include any suitably conducting material, such as TiN or doped polysilicon deposited, for example, by CVD and patterned using standard photolithographic and wet or dry etching techniques. The oxide can be grown or deposited, for example, using CVD with a tetraethylorthosilicate (TEOS) precursor.

Methods of fabricating an integrated device including a high-temperature contact of a microcircuit adjacent to a MEMS according to an embodiment of the present invention will now be described with reference to the flowchart of FIGS. 6A and 6B.

Figure 6A:
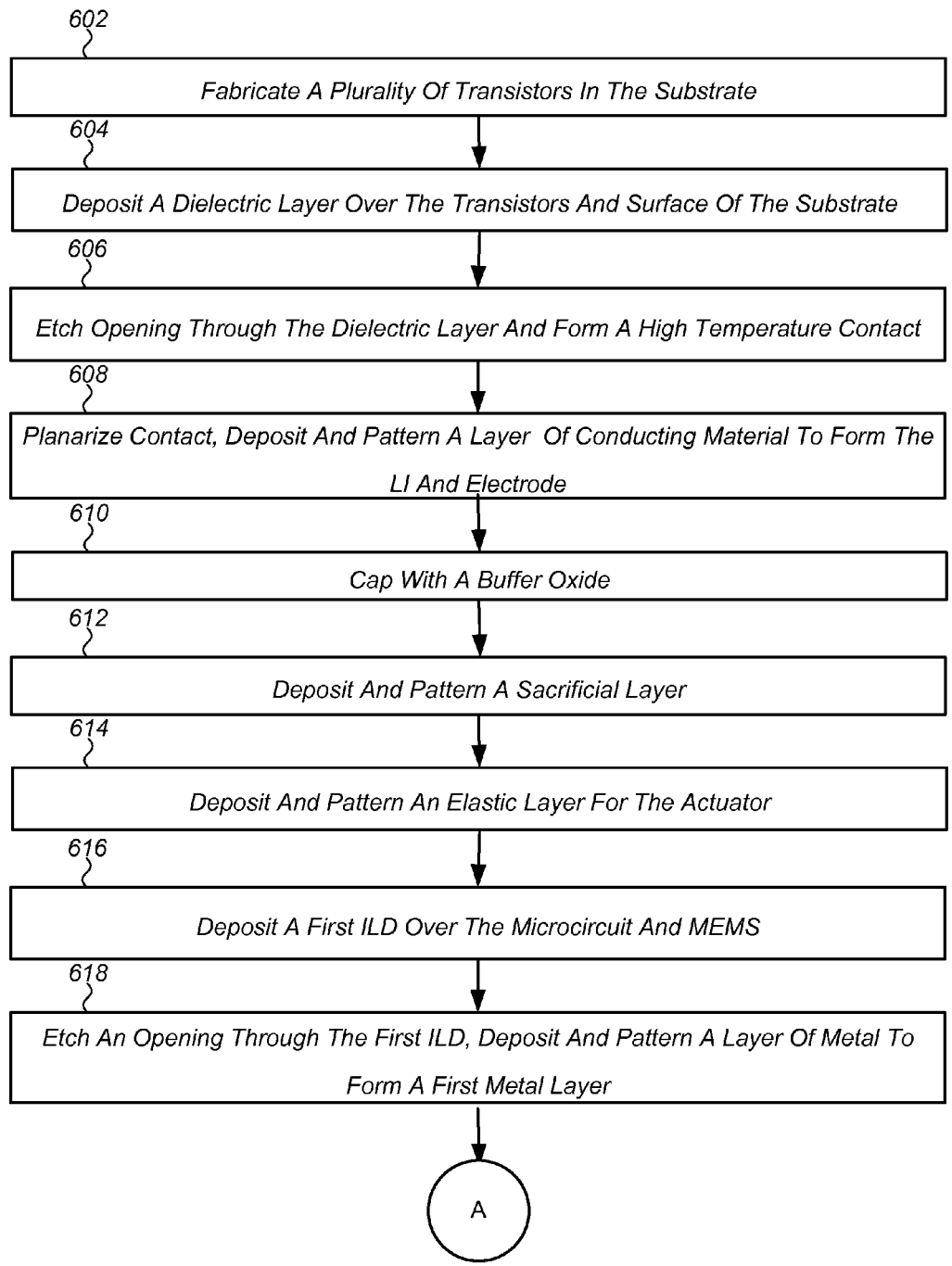
FIGS. 6A and 6B is a flowchart illustrating a method of fabricating an integrated device according to an embodiment of the present disclosure.
Figure 6B:
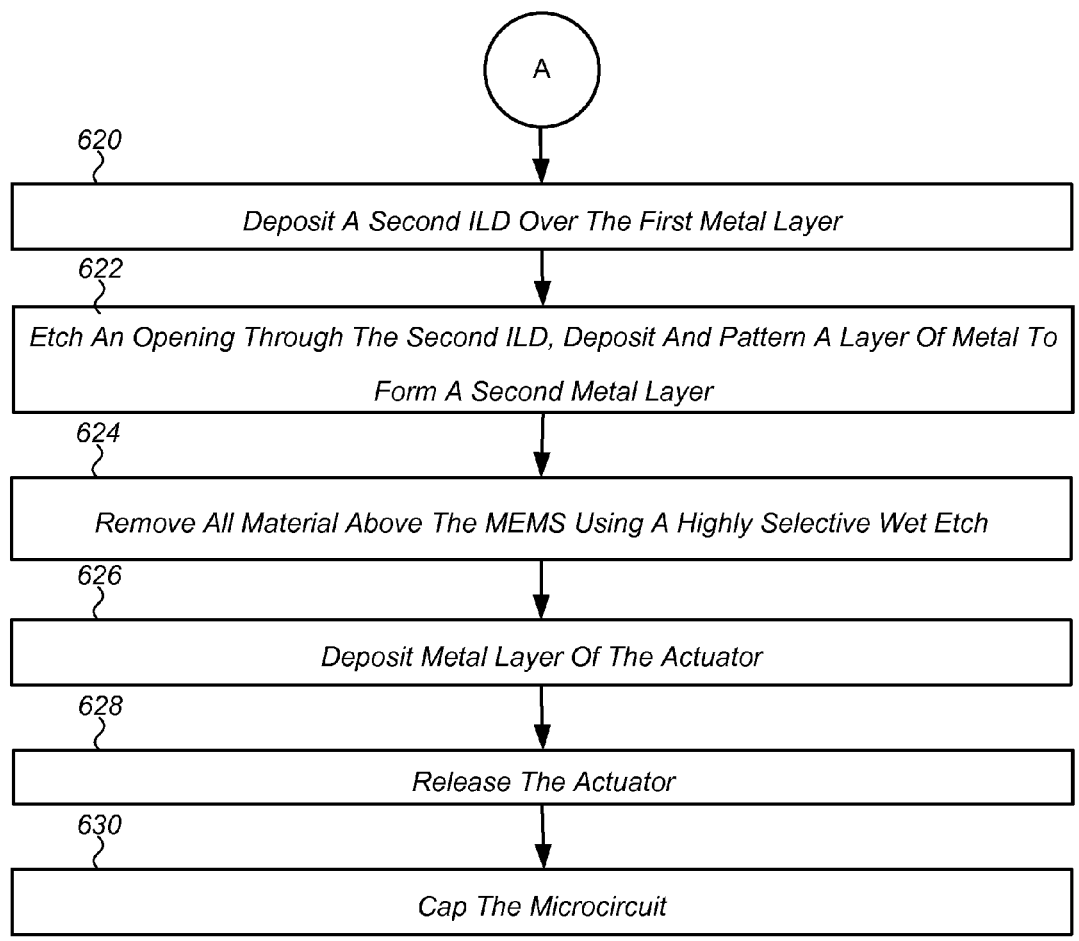

Referring to FIG. 6A, the method begins with the front-end of fabrication of a plurality of transistors in the substrate (block 602). Generally, the plurality of transistors include one or more p-type or an n-type transistor metal oxide silicon (MOS) transistors, such as those described above in relation to FIGS. 3 and 4. The transistors can be fabricated using conventional semiconductor fabrication processes. The MOS transistor configuration illustrated in FIGS. 3 and 4 is for illustrative purposes only, and is alternative conventional transistor configurations can be used in addition to or in place of the MOS transistors.

Next, a dielectric layer is formed or deposited over the transistors and a surface of the substrate (block 604). The dielectric layer is deposited over substantially the entire surface of the substrate including areas or region in which the MEMS will be formed. As noted above, the dielectric layer can include a doped or undoped oxide, such as silicon-dioxide (SiO$_2$), a nitride, such as silicon nitride (Si$_x$N$_y$), a silicon-oxynitride (Si$_x$O$_y$N$_z$) or a glass, such as phosphosilicate glass (PSG) or borophosphosilicate glass (BPSG). Optionally or preferably, the dielectric layer is then planarized by a CMP process to provide a planar surface for the subsequent contact formation steps and to reduce the thickness of the dielectric layer.

A contact opening is then etched through the dielectric layer and a high temperature contact formed therein using a process such as that described above with reference to FIGS. 5A through 5E (block 606). The contact and the dielectric layer are then planarized by a CMP process, and a TiN or doped polysilicon layer deposited and patterned to form the LI of the microcircuit and the bottom electrode of the MEMS 402 (block 608). The LI is capped with an insulating layer, such as a buffer oxide (block 610). The insulating layer together with the LI forms a high temperature cap over the tungsten plug of the contact, enabling it to withstand the high temperature processes of MEMS fabrication.

A sacrificial layer is deposited and patterned in the area or region in which the MEMS will be formed (block 612). The sacrificial layer can include, for example, silicon, and can be deposited using CVD or PECVD, and patterned using conventional photolithographic and wet or dry etch processes. Next, an elastic layer, such as a silicon nitride, is deposited and patterned to form the actuators of the MEMS (block 614). The silicon nitride elastic layer can be deposited using CVD or PECVD, and patterned using conventional photolithographic and wet or dry etch processes.

The next step is the deposition of a first ILD layer over the microcircuit and MEMS (block 616). As with the dielectric layer described above, the first ILD layer can include a doped or undoped oxide, such as silicon-dioxide (SiO$_2$), a nitride, such as silicon nitride (Si$_x$N$_y$), a silicon-oxynitride (Si$_x$O$_y$N$_z$) or a glass, such as phosphosilicate glass (PSG) or borophosphosilicate glass (BPSG). Preferably, the first ILD layer is an undoped SiO$_2$ layer. More preferably, the first ILD layer is then planarized by a CMP process to provide a planar surface for the subsequent steps and to reduce the thickness of the first ILD layer. As a result of the deposition and planarization of the first ILD layer, the MEMS is embedded in a protective layer so that a subsequent etching steps can be performed without damaging the silicon nitride layer.

An opening is then etched through the first ILD layer, and a layer of metal deposited and patterned to form a first metal layer (M1) of an interconnect to the transistors (block 618). Preferably, the metal is deposited by sputtering. Suitable metals include aluminum, titanium, tungsten, copper and alloys thereof. The patterning and etching of the metal layer is performed using conventional photolithographic and dry etching techniques. More preferably, the metal layer is overetched to ensure that all of the metal not needed in forming the interconnect is removed from the surface of the first ILD and over the MEMS. The first ILD acts as a buffer to allow for overetching of the metal layer without damaging the silicon nitride layer of the underlying MEMS. Thus, the first ILD should have a minimum thickness of from about _____ to about _____ Å.

Next, a second ILD layer is deposited over the patterned first metal layer (block 620). As with the first ILD layer, the second ILD layer can include a doped or undoped oxide, such as SiO$_2$, a nitride, such as silicon nitride, a silicon-oxynitride or a glass, such as PSG or BPSG. Preferably, the second ILD layer is an undoped SiO$_2$ layer. An opening is then etched through the second ILD and a second layer of metal deposited and patterned to form a second metal layer (M2) (block 622).

As with the first metal layer (M1), the second metal layer (M2) is overetched to ensure that all of the metal not needed in forming the interconnect is removed from the surface of the second ILD and over the MEMS.

Once the second layer of metal deposited and patterned to form a second metal layer (M2) all material above the MEMS is removed using a highly selective wet etch (block 624). This is accomplished by applying open array mask to protect the microcircuit interconnects while removing the first and second ILD material above the MEMS using a highly selective 10:1 buffered oxide etch (BOE) wet etch. Alternatively, the wet etch can be performed using a 20:1 BOE wet etch, a 50:1 hydrofluoric (HF) wet etch, a pad etch, or any other similar hydrofluoric-based wet oxide etching chemistry.

Next, a layer of a metal is deposited on the exposed silicon nitride of the actuators to form a reflective surface and actuator electrodes (block 626). Preferably, the metal layer is a thin layer formed using low-temperature processing steps, which are compatible with the low-temperature processing such as sputtering. More preferably, the reflective metal layer is aluminum.

Openings are then etched through selected areas of the metal layer and the silicon nitride through which an etchant, such as xenon diflouride ($XeF_2$), is introduced to etch or remove the sacrificial layer, releasing the actuator (block 628). The openings can include rib cuts patterned in the metal layer and the silicon nitride to form ribbons of a GLV™ type spatial light modulator.

Finally, the microcircuit can be encapsulated in one or more layers of a cap-oxide or nitride (block 630) to electrically insulate and protect the microcircuit during backend processing and packaging.

In the preceding description, for purposes of explanation, numerous specific details have been set forth in order to provide a thorough understanding of the fabrication method of the present disclosure. It will be evident; however, to one skilled in the art that the present method may be practiced to form integrated devices including MEMS devices, microcircuits and/or ICs without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the integrated device. The appearances of the phrase "one embodiment" in various places in the specification do not necessarily all refer to the same embodiment. The term "to couple" as used herein may include both to directly connect and to indirectly connect through one or more intervening components.

The foregoing description of specific embodiments and examples have been presented for the purpose of illustration and description, and although described and illustrated by certain of the preceding examples, the integrated device, MEMS, microcircuits and ICs disclosed herein are not to be construed as being limited thereby. They are not intended to be exhaustive or to limit the method to the precise forms disclosed, and many modifications, improvements and variations within the scope of the disclosure are possible in light of the above teaching.

What is claimed is:

1. A method of fabricating an integrated device comprising:
   forming a contact opening through a dielectric layer to an underlying structure of a microcircuit on a substrate;
   depositing a multi-layer seed layer comprising a refractory metal on a surface of the contact opening, wherein depositing the seed layer comprises depositing a layer of titanium (Ti), and further depositing a layer of titanium-tungsten (TiW) on the Ti layer;
   nitriding the TiW layer of the multi-layer seed layer to form a barrier layer on a surface thereof; and
   depositing a metal over the barrier layer to form a high temperature contact in the opening;
   forming a temperature resistant cap over the high temperature contact.

2. A method according to claim 1, further comprising fabricating a MicroElectroMechanical System (MEMS) on the substrate using high temperature processing steps, wherein at least a portion of the MEMS overlies and electrically couples to the high temperature contact.

3. A method according to claim 1, wherein nitriding the multi-layer seed layer comprises heating the substrate in a nitrogen containing atmosphere.

4. A method according to claim 3, wherein heating the substrate comprises heating the substrate to a temperature of between 750 to 950° C. to sinter the multi-layer seed layer.

5. A method according to claim 3, wherein heating the substrate in a nitrogen containing atmosphere comprises introducing ammonia ($NH_3$) into a process chamber of a process tool at a flow rate of between 10 to 10,000 standard cubic centimeters per minute (sccm).

6. A method according to claim 3, wherein heating the substrate comprises heating the substrate in a rapid thermal processing (RTP) tool for between 10 to 500 seconds.

7. A method according to claim 1, further comprising cleaning the contact opening using an RF sputter etch-clean prior to depositing the multi-layer seed layer.

8. A method according to claim 1, wherein depositing a metal over the barrier layer to form the contact in the opening comprises depositing tungsten (W).

9. A method according to claim 8, further comprising planarizing the tungsten using chemical mechanical planarization (CMP) prior to forming the temperature resistant cap over the contact.

10. A method according to claim 1, wherein forming the temperature resistant cap over the contact comprises forming a polysilicon local interconnect (LI) covered by an oxide over the contact.

11. A method of fabricating an integrated device comprising:
    forming a contact opening through a dielectric layer to an underlying element of a microcircuit formed adjacent to a MicroElectroMechanical System (MEMS) structure on a substrate;
    depositing a multi-layer seed layer comprising a refractory metal on a surface of the contact opening, wherein depositing the multi-layer seed layer comprises depositing a layer of titanium (Ti), and further depositing a layer of titanium-tungsten (TiW) on the Ti layer;
    nitriding the TiW layer of the multi-layer seed layer to form a barrier layer on a surface thereof;
    depositing a metal over the barrier layer to form a high temperature contact in the opening; and
    depositing a layer of conducting material over the dielectric layer, and patterning the layer of conducting material to form a local interconnect (LI) for the microcircuit overlying and electrically coupled to the high temperature contact and a bottom electrode for the adjacent MEMS structure.

12. A method according to claim 11, further comprising forming a temperature resistant cap over the high temperature contact.

13. The method of claim 11, further comprising depositing and patterning a sacrificial layer over the bottom electrode of the MEMS structure, and depositing a silicon nitride elastic layer over the patterned sacrificial layer to form an actuator of the MEMS using high temperature processing steps.

14. A method according to claim 11, further comprising forming a buffer oxide over the LI of the microcircuit, and wherein the buffer oxide and LI form a temperature resistant cap over the high temperature contact.

15. The method of claim 11, further comprising:
depositing a first interlevel dielectric (ILD) over the LI and the MEMS structure;
etching an opening through the first ILD to the LI, depositing and patterning a layer of metal to form a first metal interconnect (M1) layer for the microcircuit overlying and electrically coupled to the LI; and
wherein the layer of metal is patterned by overetching using a dry etch process and the first ILD protects the silicon nitride of the MEMS structure.

16. The method of claim 15, further comprising:
depositing a second ILD over the first M1 layer and the MEMS structure;
etching an opening through the second ILD to the M1 layer, depositing and patterning a layer of metal to form a second metal interconnect (M2) layer for the microcircuit overlying and electrically coupled to the M1 layer using a dry etch process.

17. The method of claim 16, further comprising forming a mask over the microcircuit and removing the first and second ILD overlying the MEMS structure using a selective wet etch process.

18. An integrated device comprising a diffractive light modulator adjacent to a microcircuit on a single substrate, the microcircuit including a plurality of transistors formed in the substrate, a local interconnect (LI) layer through which the plurality of transistors are electrically coupled to the diffractive light modulator, and a high temperature contact through a dielectric layer to electrically couple the LI layer to at least one of the underlying plurality of transistors, and wherein the high temperature contact comprises a multi-layer seed layer including a titanium (Ti) layer in contact with at least one of the underlying plurality of transistors formed in the substrate and a titanium-tungsten (TiW) layer on the Ti layer, and a barrier layer comprising a nitrided portion of the TiW layer, a metal deposited over the barrier layer and a temperature resistant cap.

19. An integrated device according to claim 18, wherein the temperature resistant cap comprises the LI layer over the metal deposited over the barrier layer, and a buffer oxide over the LI layer.

* * * * *